(12) United States Patent
Kawakami et al.

(10) Patent No.: US 7,692,102 B2
(45) Date of Patent: Apr. 6, 2010

(54) ELECTRONIC CIRCUIT DEVICE

(75) Inventors: Yoshiteru Kawakami, Kanagawa (JP); Yasuharu Nakamura, Nagano (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/195,719

(22) Filed: Aug. 3, 2005

(65) Prior Publication Data
US 2006/0032669 A1     Feb. 16, 2006

(30) Foreign Application Priority Data
Aug. 11, 2004   (JP)   ............................ 2004-234052

(51) Int. Cl.
  *H05K 1/00*   (2006.01)
(52) U.S. Cl. .................... 174/254; 361/803; 361/804
(58) Field of Classification Search ................ 174/260, 174/261, 254, 255; 439/67, 77; 361/799, 361/749–751, 803, 804
See application file for complete search history.

(56) References Cited

U.S. PATENT DOCUMENTS

| | | | | |
|---|---|---|---|---|
| 5,764,497 | A * | 6/1998 | Mizumo ...................... | 361/803 |
| 6,545,226 | B2 * | 4/2003 | Brodsky et al. ............. | 174/260 |
| 6,721,189 | B1 * | 4/2004 | Haba .......................... | 361/792 |
| 6,784,375 | B2 * | 8/2004 | Miyake et al. ............... | 174/261 |
| 7,095,476 | B2 * | 8/2006 | Lo et al. ...................... | 349/150 |
| 7,348,492 | B1 * | 3/2008 | Kawai et al. ................. | 174/254 |
| 7,378,596 | B2 * | 5/2008 | Kawaguchi et al. ......... | 174/255 |
| 2001/0027605 | A1 * | 10/2001 | Nabemoto et al. ............ | 29/830 |
| 2001/0053068 | A1 * | 12/2001 | Murayama et al. ........... | 361/760 |
| 2002/0114143 | A1 * | 8/2002 | Morrison et al. ............ | 361/749 |
| 2004/0060733 | A1 * | 4/2004 | Brodsky ...................... | 174/260 |
| 2004/0064941 | A1 * | 4/2004 | Dozier et al. ................. | 29/837 |
| 2005/0189140 | A1 * | 9/2005 | Tseng ......................... | 174/260 |
| 2005/0221633 | A1 * | 10/2005 | Wildes et al. ................. | 439/67 |
| 2006/0060960 | A1 * | 3/2006 | Cho et al. .................... | 257/700 |

FOREIGN PATENT DOCUMENTS

| | | |
|---|---|---|
| JP | 52-82861 | 6/1977 |
| JP | 59-104574 | 7/1984 |
| JP | 1-165674 | 11/1989 |

OTHER PUBLICATIONS

U.S. Appl. No. 11/195,818, filed Aug. 3, 2005, Kawakami, et al.

* cited by examiner

*Primary Examiner*—Jinhee J Lee
*Assistant Examiner*—Abiy Getachew
(74) *Attorney, Agent, or Firm*—Oblon, Spivak, McClelland, Maier & Neustadt, L.L.P.

(57) ABSTRACT

An electronic circuit device includes at least two circuit substrates for mounting electronic components and a flexible board for external electrical connection disposed between the circuit substrates. The flexible board is electrically connected to at least the surface of one circuit substrate opposed to another circuit substrate.

7 Claims, 14 Drawing Sheets

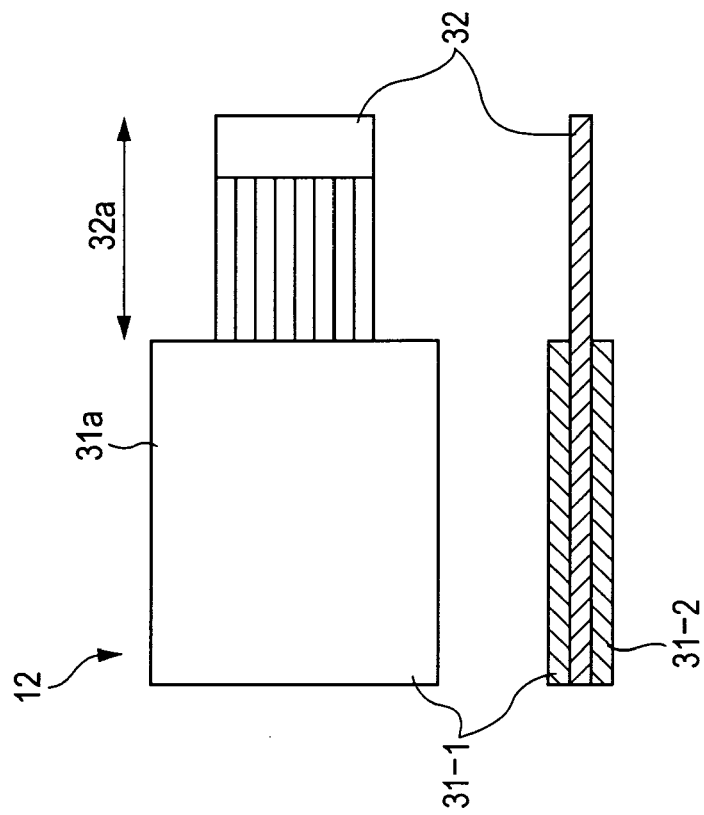
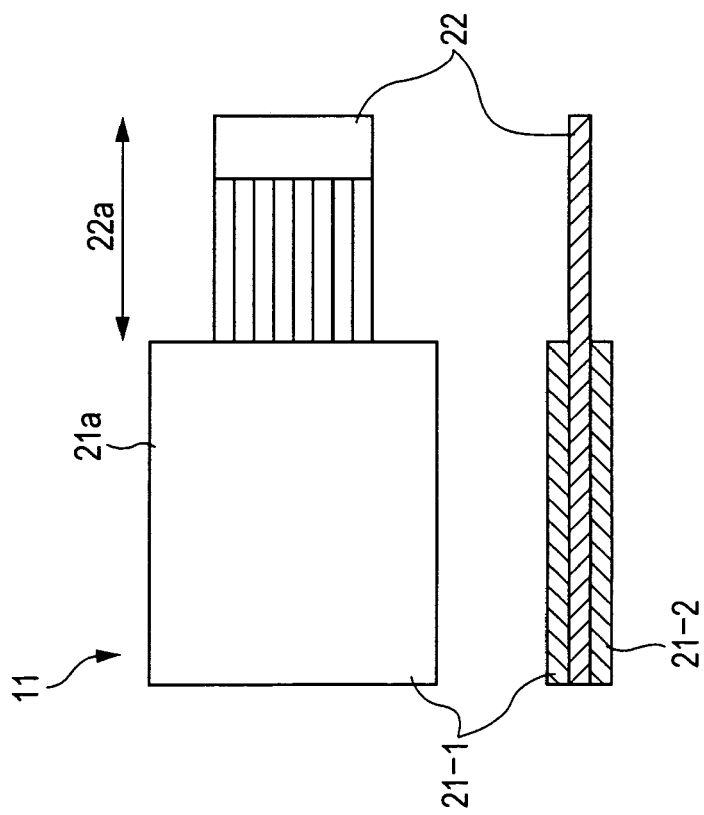

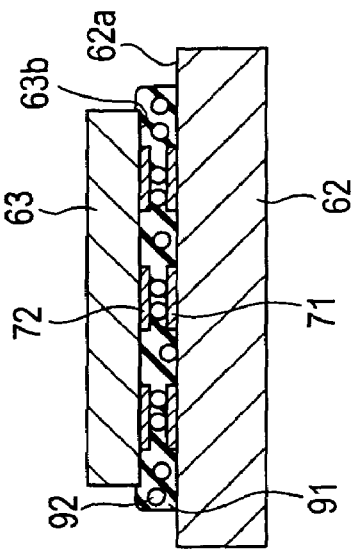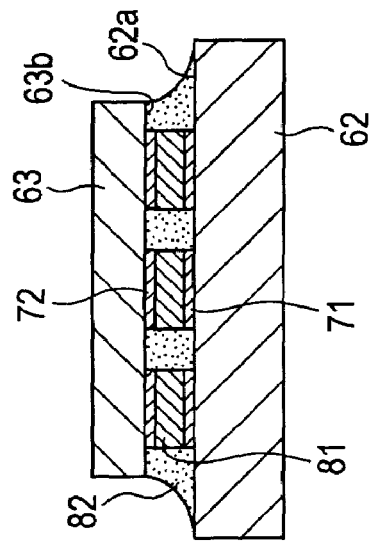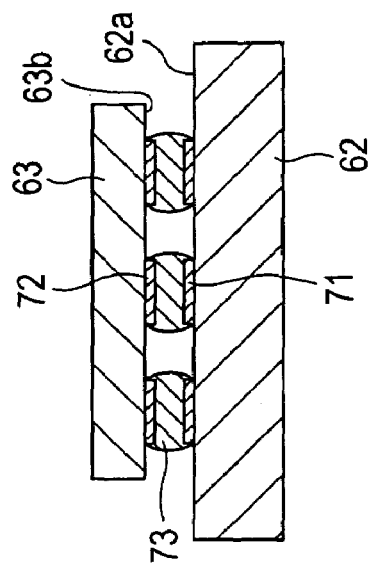

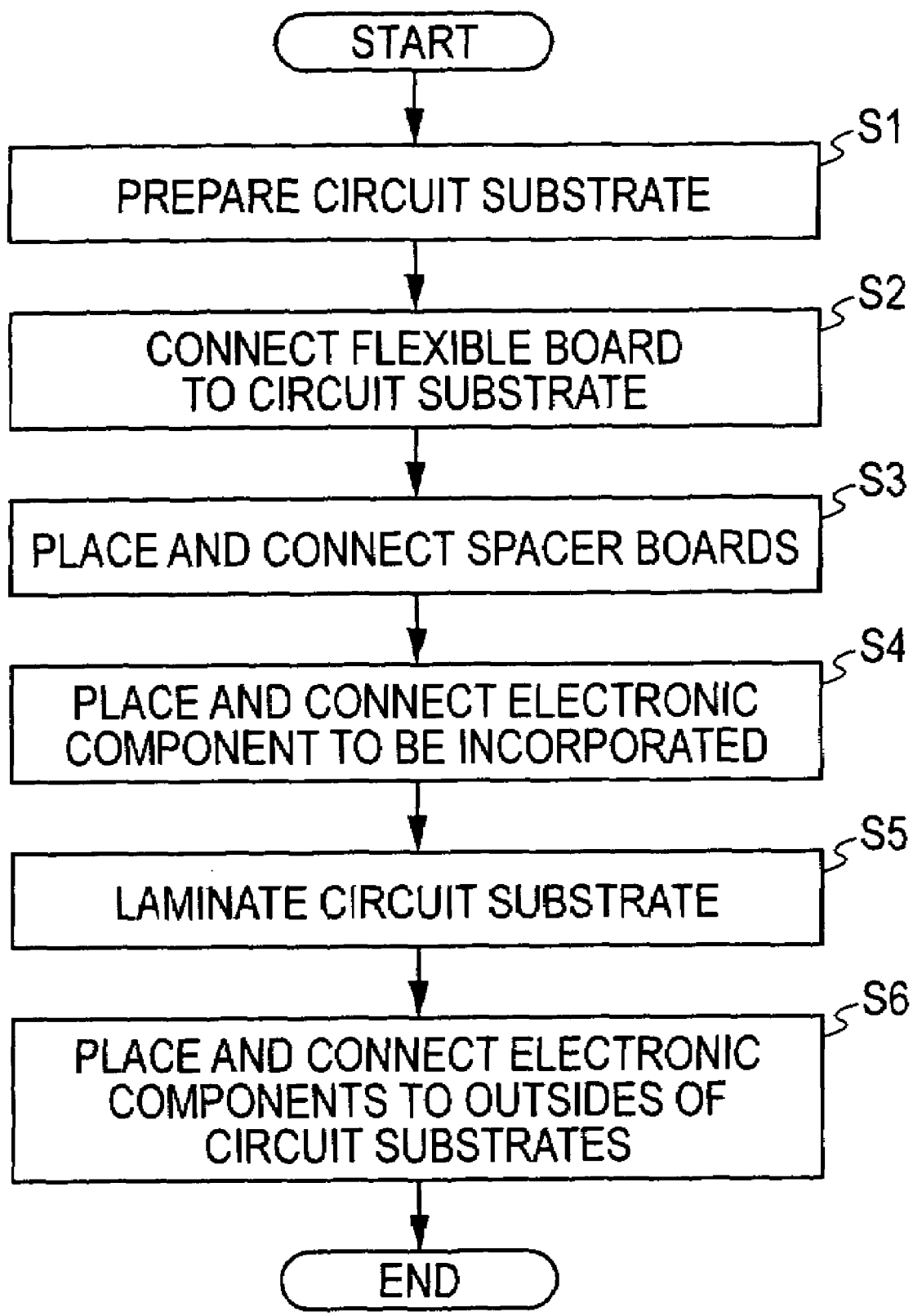

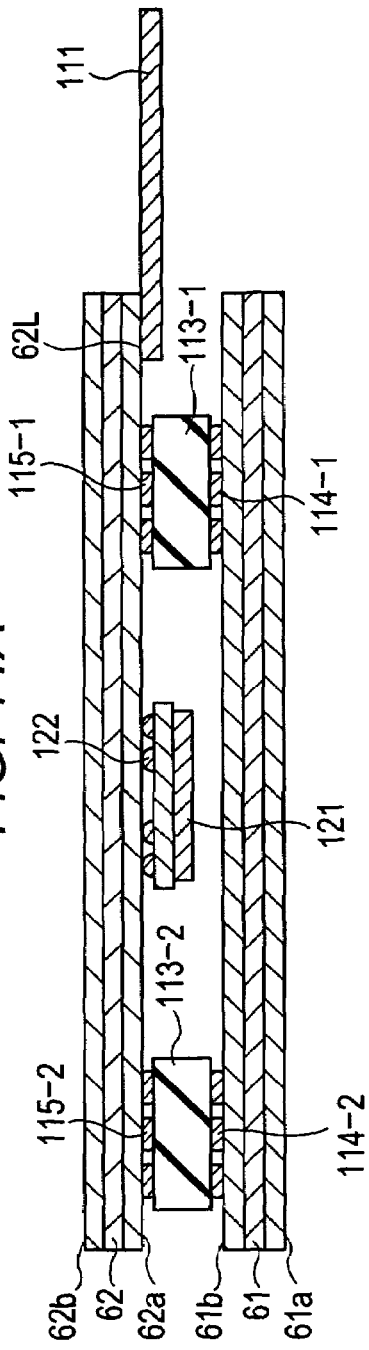
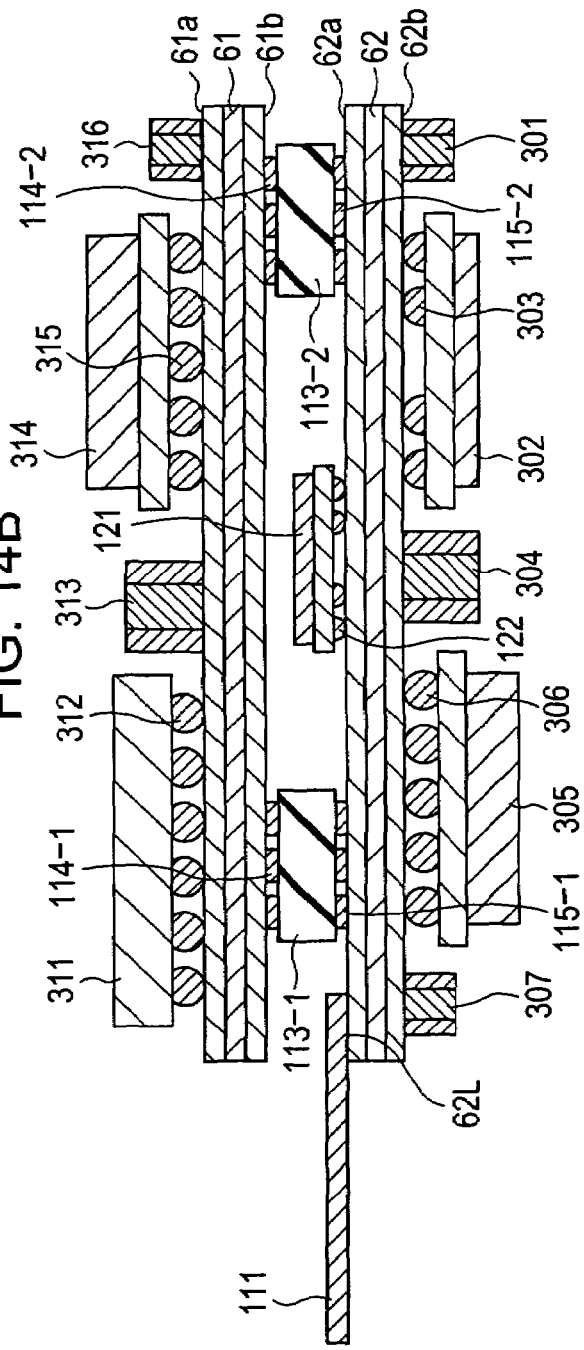
FIG. 14A
FIG. 14B

ELECTRONIC CIRCUIT DEVICE

CROSS REFERENCES TO RELATED APPLICATIONS

The present invention contains subject matter related to Japanese Patent Application JP 2004-234052 filed in the Japanese Patent Office on Aug. 11, 2004, the entire contents of which are incorporated herein by reference.

BACKGROUND OF THE INVENTION

1. Field of the Invention

The present invention relates to electronic circuit devices, and particularly relates to an electronic circuit device capable of mounting electronic components at high density.

2. Description of the Related Art

In the field of mobile terminals and information appliances, electronic circuit devices composed of multilayer substrates capable of achieving higher packing densities have been used, as disclosed in PCT Japanese Translation Patent Publication No. 7-107954. The demand on such electronic circuit devices for size and weight reductions and higher functions has been increasing in recent years.

According to the demand, flexible cables and substrates, which can be bended, are often used to connect the above multilayer substrates.

FIG. 1 shows a top view (upper) and a longitudinal sectional view (lower) of an example of a rigid substrate and a flexible cable connected thereto with a connector.

In FIG. 1, a rigid substrate 1 includes three laminated insulating boards, such as glass-epoxy boards, having an electrical circuit made of copper foil. A flexible cable 2 is made of a polyimide film instead of an insulating board. The flexible cable 2 is used to connect the rigid substrate 1 to, for example, an external interface or another substrate (not shown).

The flexible cable 2 is connected to a right end region 1b of the top surface 1a of the rigid substrate 1 with a connector 3. That is, the region 1b of the top surface 1a of the rigid substrate 1 is assigned to the connector 3 to connect the flexible cable 2 to the rigid substrate 1. As a result, other electronic components such as semiconductor chips and resistors cannot be mounted in the right end region 1b. The rigid substrate 1 therefore has difficulty in providing electronic circuit devices with higher densities. Accordingly, a rigid/flexible substrate and a multilayer flexible substrate as shown in FIGS. 2A and 2B are used to eliminate the need for the connector 3.

FIG. 2A shows a top view (upper) and a longitudinal sectional view (lower) of an example of a rigid/flexible substrate. FIG. 2B shows a top view (upper) and a longitudinal sectional view (lower) of an example of a multilayer flexible substrate.

In FIG. 2A, a rigid/flexible substrate 11 includes two rigid boards 21-1 and 21-2 laminated with a flexible board 22 disposed therebetween. The flexible board 22 is longer than the rigid boards 21-1 and 21-2 by the length of a cable part (connection part) 22a for connection to another substrate. Unlike the flexible cable 2, the rigid/flexible substrate 11 has no connector so that electronic components can be mounted on the overall top surface 21a of the rigid board 21-1.

In FIG. 2B, a multilayer flexible substrate 12 includes two flexible boards 31-1 and 31-2 laminated with another flexible board 32 disposed therebetween. The flexible board 32 is longer than the flexible boards 31-1 and 31-2 by the length of a cable part (connection part) 32a for connection to another substrate. That is, the multilayer flexible substrate 12 differs from the rigid/flexible substrate 11 only in that the flexible boards 31-1 and 31-2 are used instead of the rigid boards 21-1 and 21-2. Accordingly, unlike the flexible cable 2, the multilayer flexible substrate 12 has no connector so that electronic components can be mounted on the overall top surface 31a of the flexible board 31-1.

There is another approach to eliminating the use of a connector. FIG. 3 shows a top view (upper) and a longitudinal sectional view (lower) of an example of a rigid substrate.

In FIG. 3, a flexible cable 42 is partially bonded directly to a right end region 41b of the top surface 41a of a three-layer rigid substrate 41 with, for example, solder or an anisotropic conductive film. The direct bonding of the flexible cable 42 to the rigid substrate 41 is used as one of the approaches to eliminating the use of a connector.

SUMMARY OF THE INVENTION

However, flexible cables and boards as described above, which are made of polyimide, are more costly than rigid boards, which are, for example, glass epoxy boards.

If, therefore, the rigid/flexible substrate 11 in FIG. 2A is used to provide higher-density electronic circuit devices with no connector, the flexible board 22 is used, which has a size equivalent to the sum of the sizes of the rigid boards 21-1 and 21-2 and the cable part 22a. If the multilayer flexible substrate 12 in FIG. 2B is used, the flexible boards 31-1 and 31-2 are used in addition to the flexible board 32. Thus, the use of the rigid/flexible substrate 11 or the multilayer flexible substrate 12 for achieving higher densities disadvantageously results in higher cost.

If the flexible cable 42 is bonded directly to the rigid substrate 41, as shown in FIG. 3, electronic components cannot be mounted in the region 41b used for partially connecting the flexible cable 42 on the top surface 41a of the rigid substrate 41, though the region 41b is smaller than the region 1b used for connecting the connector 3 in FIG. 1.

Under the above circumstances, it is desirable to provide an electronic circuit device capable of mounting electronic components at high density with no increase in cost.

An electronic circuit device according to an embodiment of the present invention includes at least two circuit substrates and a flexible board for external electrical connection disposed between the circuit substrates. The flexible board is electrically connected to at least the surface of one circuit substrate opposed to another circuit substrate.

The flexible board may be electrically and physically connected to a predetermined region of the surface of the one circuit substrate with a solder, a metal paste, or an anisotropic conductive adhesive.

The electronic circuit device may further include a spacer board disposed between the circuit substrates. The spacer board connects the circuit substrates to each other.

The spacer board may be electrically and physically connected to the circuit substrates with a solder, a metal paste, or an anisotropic conductive adhesive.

The spacer board may include the flexible board, and then the flexible board may be electrically connected to the circuit substrates through the spacer board.

According to the embodiment of the present invention, electronic components may be mounted at high density with no increase in cost.

BRIEF DESCRIPTION OF THE DRAWINGS

FIGS. 2A and 2B show diagrams of examples of a rigid/flexible substrate and a multilayer flexible substrate, respectively, in the related art;

FIGS. 5A to 5C are diagrams illustrating methods for connecting a flexible board to a circuit substrate;

FIG. 12 is a flowchart of a mounting process for producing an electronic circuit device according to an embodiment of the present invention;

FIGS. 14A and 14B are diagrams illustrating mounting steps for the electronic circuit device.

DESCRIPTION OF THE PREFERRED EMBODIMENTS

Figure 1:
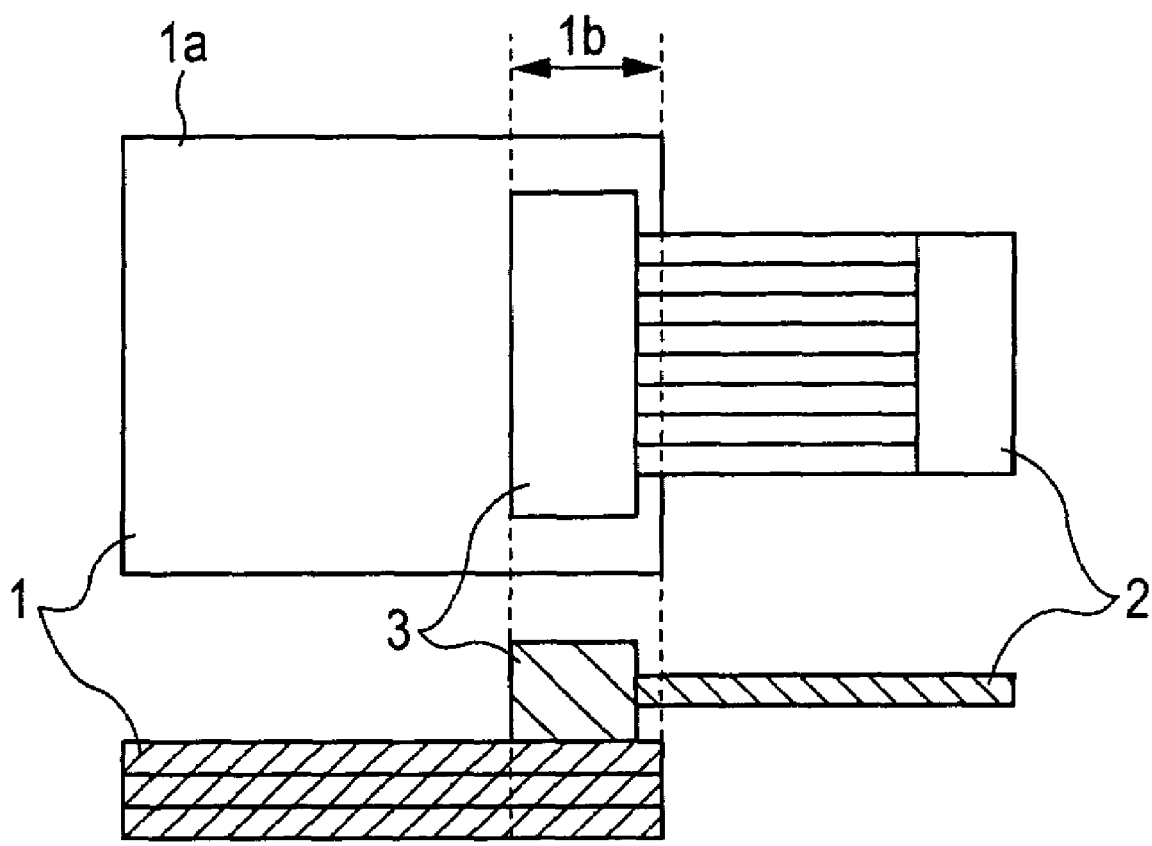
FIG. 1 shows diagrams of an example of a rigid substrate and a flexible cable connected thereto in the related art.
Figure 3:
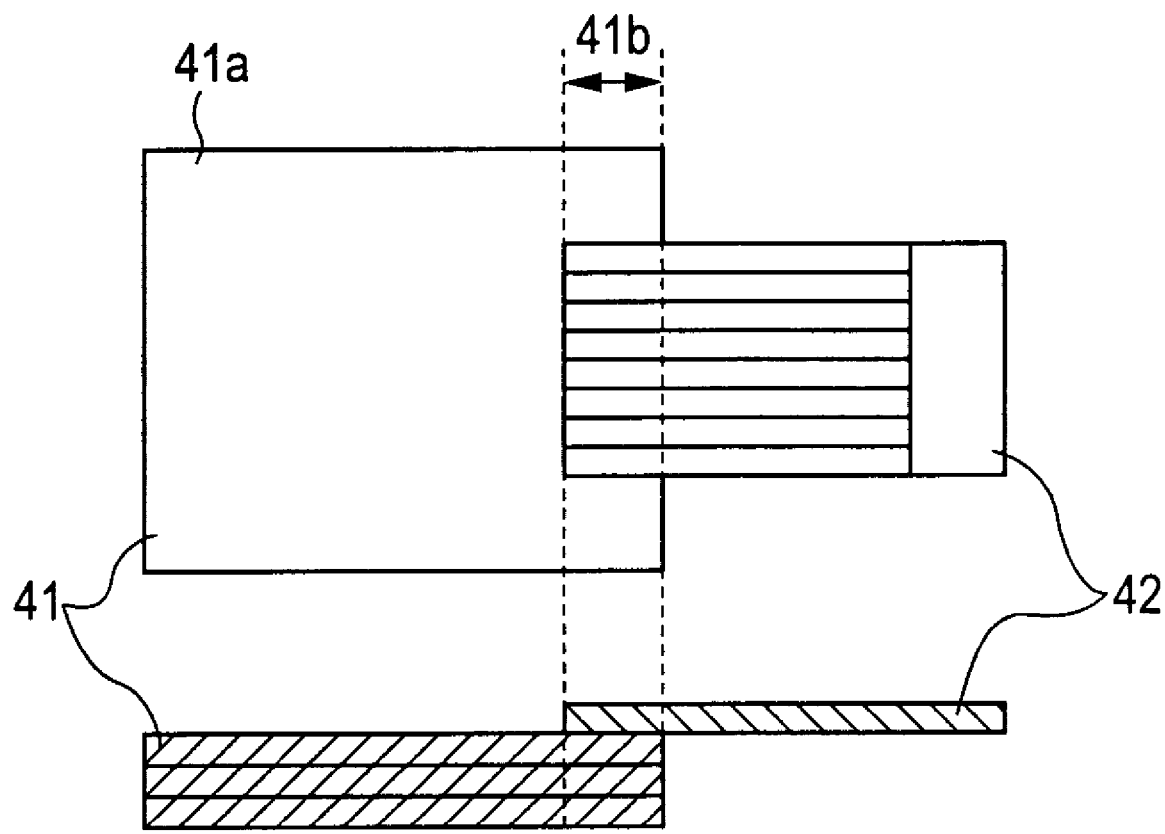
FIG. 3 shows diagrams of another example of a rigid substrate and a flexible cable connected thereto in the related art.

Before embodiments of the present invention are described, the correspondence between the features of the claims and the specific elements disclosed in an embodiment of the present invention is discussed below. This description is intended to assure that specific elements disclosed in an embodiment supporting the claimed invention are described in this specification. Thus, even if an element in an embodiment is not described as relating to a certain feature of the present invention, that does not necessarily mean that the element does not relate to that feature of the claims. Conversely, even if an element is described herein as relating to a certain feature of the claims, that does not necessarily mean that the element does not relate to other features of the claims.

Furthermore, this description should not be construed as restricting that all the aspects of the invention disclosed in an embodiment are described in the claims. That is, the description does not deny the existence of aspects of the present invention that are described in an embodiment but not claimed in the invention of this application, i.e., the existence of aspects of the present invention that in future may be claimed by a divisional application, or that may be additionally claimed through amendments.

An electronic circuit device according to an embodiment of the present invention (for example, an electronic circuit device 51 in FIG. 4) includes at least two circuit substrates (for example, circuit substrates 61 and 62 in FIG. 4) and a flexible board (for example, flexible boards 63-1 in FIG. 4) for external electrical connection disposed between the circuit substrates. The flexible board is electrically connected to at least the surface of one circuit substrate opposed to another circuit substrate (for example, the top surface 62a of the circuit substrate 62 in FIG. 4).

In an electronic circuit device according to another embodiment of the present invention, a flexible board is electrically and physically connected to a predetermined region of a surface of one circuit substrate (for example, a region 62L in FIG. 4) with a solder (for example, a solder 73 in FIG. 5A), a metal paste (for example, a metal paste 81 in FIG. 5B), or an anisotropic conductive adhesive (for example, an anisotropic conductive film made of a binder 91 and conductive particles 92 in FIG. 5C).

An electronic circuit device according to another embodiment of the present invention (for example, an electronic circuit device 101 in FIG. 6) further includes a spacer board (for example, a spacer board 113-1 in FIG. 6) disposed between circuit substrates. The spacer board connects the circuit substrates to each other.

Figure 8:
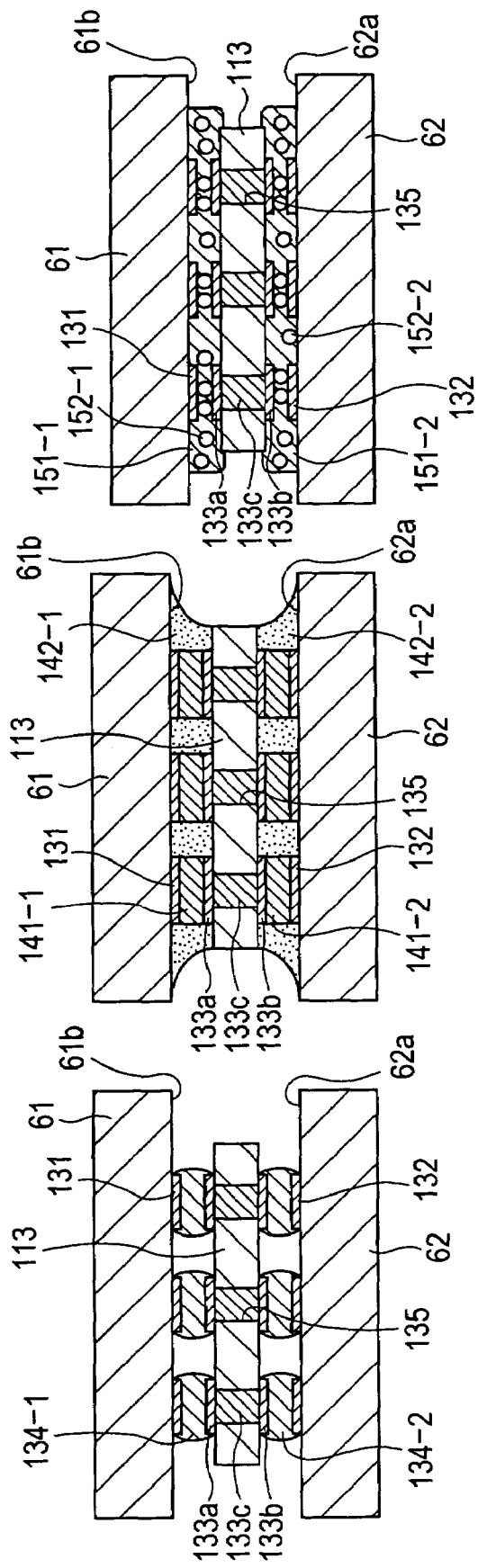
FIGS. 8A to 8C are diagrams illustrating methods for connecting a spacer board to circuit substrates.

An electronic circuit device according to another embodiment of the present invention, a spacer board is electrically and physically connected to circuit substrates with a solder (for example, a solder 134-1 in FIG. 8A), a metal paste (for example, a metal paste 141-1 in FIG. 8B), or an anisotropic conductive adhesive (for example, an anisotropic conductive film made of a binder 151-1 and conductive particles 152-1 in FIG. 8C).

In an electronic circuit device according to another embodiment of the present invention (for example, an electronic circuit device 201 in FIG. 10), a spacer board (for example, a spacer board 211-1 in FIG. 10) includes a flexible board (for example, a spacer board 223-1 in FIG. 10), and the flexible board is electrically connected to circuit substrates (for example, circuit substrates 61 and 62 in FIG. 10) through the spacer board.

Embodiments of the present invention will now be described with reference to the drawings.

Figure 4:
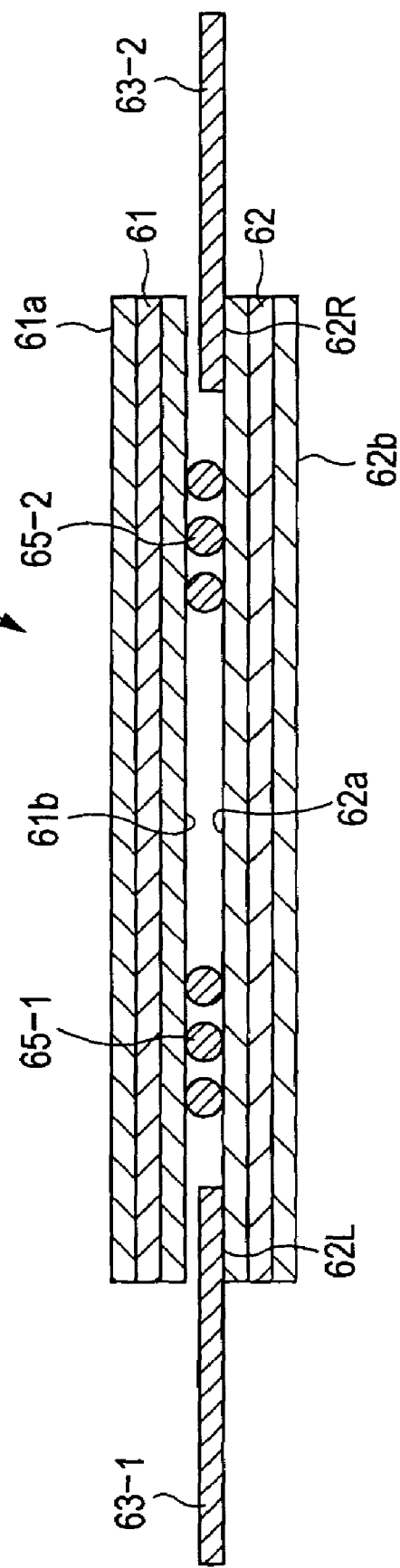
FIG. 4 is a longitudinal sectional view of an electronic circuit device according to an embodiment of the present invention.

FIG. 4 is a longitudinal sectional view of an electronic circuit device according to an embodiment of the present invention.

In FIG. 4, an electronic circuit device 51 includes an upper circuit substrate 61 and a lower circuit substrate 62 that are laminated with flexible boards 63-1 and 63-2 connected therebetween. The flexible boards 63-1 and 63-2 are hereinafter collectively referred to as flexible boards 63 unless they are individually distinguished.

The circuit substrates 61 and 62 each include, for example, three laminated insulating rigid boards, such as glass-epoxy boards, having an electrical circuit made of copper foil (not shown). In practice, the circuit substrates 61 and 62 have substantially the same size as, for example, the rigid substrate 1 in FIG. 1. The circuit substrates 61 and 62 may also be composed of a single rigid board or three or more rigid boards. The electronic circuit does not have to be formed on every rigid board laminated.

Lands (thin metal films, not shown) are formed at opposed positions of the bottom surface 61b of the circuit substrate 61 (the surface opposed to the circuit substrate 62) and the top surface 62a of the circuit substrate 62 (the surface opposed to the circuit substrate 61). These lands are electrically and mechanically (physically) connected to each other with connecting members 65-1 and 65-2 made of, for example, solder. The circuit substrates 61 and 62 are separated by a distance of about 0.2 to 0.3 mm. In FIG. 4, three connecting members 65-1 and three connecting members 65-2 are shown.

The bottom surface of the flexible board 63-1 (the surface opposed to the circuit substrate 62) is electrically and mechanically connected to a left end region 62L of the top surface 62a of the circuit substrate 62 with, for example, solder, a metal paste, or an anisotropic conductive film. Similarly, the bottom surface of the flexible board 63-2 is electrically and mechanically connected to a right end region 62R of the top surface 62a of the circuit substrate 62 with, for example, solder, a metal paste, or an anisotropic conductive film. The left end region 62L and the right end region 62R are the minimum regions used for connection.

The flexible boards 63 are thinner than the distance between the circuit substrates 61 and 62 (about 0.2 to 0.3 mm), and are made of, for example, a polyimide film instead of an insulating board. The flexible boards 63 function to electrically connect the electronic circuit device 51 to, for example, an external interface or another electronic circuit device (not shown).

Though the electronic circuit device 51 in FIG. 4 has the two flexible boards 63, more flexible boards 63 may be connected in practice; the number of flexible boards 63 connected to the electronic circuit device 51 is not limited. In addition, though the flexible boards 63 are connected to the top surface 62a of the circuit substrate 62, they may also be connected to the bottom surface 61b of the circuit substrate 61.

In the electronic circuit device 51, as described above, the flexible boards 63 are electrically and mechanically connected to either the top surface 62a of the circuit substrate 62 or the bottom surface 61b of the circuit substrate 61. Thus, no region on the top surface 61a of the circuit substrate 61 and the bottom surface 62b of the circuit substrate 62 is used for connecting the flexible boards 63 for connection to, for example, an external interface or another electronic circuit device. Accordingly, various electronic components may be placed (mounted) on the overall top surface 61a of the circuit substrate 61 and the overall bottom surface 62b of the circuit substrate 62. This allows the electronic circuit device 51 to mount electronic components at high density.

In addition, the flexible boards 63 are connected only to the left end region 62L and right end region 62R of the circuit substrate 62. The flexible boards 63 may therefore be made of a smaller amount of polyimide than those of the rigid/flexible substrate 11 and the multilayer flexible substrate 12 described above with reference to FIGS. 2A and 2B, in which a polyimide film larger than the rigid boards 21 is used. This results in lower material cost.

Examples of the electronic components mounted on the electronic circuit device 51 include semiconductor chips such as central processing units (CPUs), memory, and digital signal processors (DSPs) and those packaged on substrates (hereinafter referred to as chip-type electronic components), resistors, and capacitors.

Next, examples of methods for connecting the flexible boards 63 to the circuit substrate 62 are described below with reference to FIGS. 5A to 5C.

In an example shown in FIG. 5A, three lands 71 are formed with, for example, copper foil on the top surface 62a of the circuit substrate 62, and three lands 72 corresponding to the lands 71 are formed with, for example, copper foil on the bottom surface 63b of the flexible board 63. The lands 72 are connected to the lands 71 with a solder 73 to electrically and mechanically connect the flexible board 63 to the circuit substrate 62.

In an example shown in FIG. 5B, the three lands 72 formed on the bottom surface 63b of the flexible board 63 are connected to the three lands 71 formed on the top surface 62a of the circuit substrate 62 with a metal paste 81, such as a silver (Ag) paste or a copper (Cu) paste, to electrically and mechanically connect the flexible board 63 to the circuit substrate 62. In this example, additionally, a sealing resin 82 (dotted areas) is charged into the space between the top surface 62a of the circuit substrate 62 and the bottom surface 63b of the flexible board 63 to increase the connection strength therebetween and inhibit the intrusion of, for example, moisture.

In an example shown in FIG. 5C, the three lands 72 formed on the bottom surface 63b of the flexible board 63 are connected to the three lands 71 formed on the top surface 62a of the circuit substrate 62 with an anisotropic conductive film (ACF) made of a binder (insulating resin) 91 and conductive particles 92 to electrically and mechanically connect the flexible board 63 to the circuit substrate 62. The lands 71 and 72 are electrically connected through the conductive particles 92 disposed therebetween.

The solder 73, the metal paste 81, and the anisotropic conductive film may be removed by heat treatment.

According to comparisons of the above connection methods, the solder 73 in FIG. 5A may be used with no dedicated equipment for connection, and has lower connection resistance and a larger connection pitch than the metal paste 81 and the anisotropic conductive film. The metal paste 81 in FIG. 5B has higher connection cost, higher connection resistance, and a smaller connection pitch than the solder 73. The anisotropic conductive film in FIG. 5C has higher connection cost and a smaller connection pitch than the solder 73, and is used with dedicated bonding equipment.

The method used for connecting the flexible boards 63 to the circuit substrate 62 is not limited to the above connection methods, and they may also be connected by another method.

Figure 6:
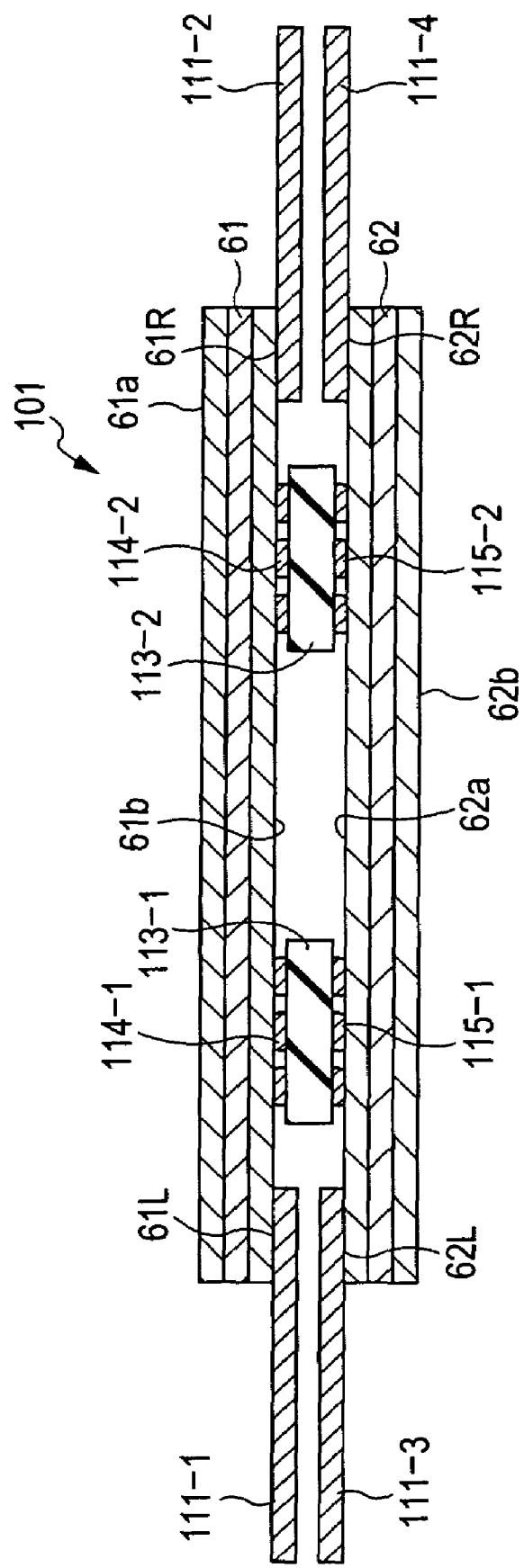
FIG. 6 is a longitudinal sectional view of an electronic circuit device according to another embodiment of the present invention.

FIG. 6 is a longitudinal sectional view of an electronic circuit device according to another embodiment of the present invention. In FIG. 6, the parts corresponding to those in FIG. 4 are indicated by the corresponding reference numerals, and the description thereof is properly omitted to avoid repetition.

In FIG. 6, an electronic circuit device 101 includes an upper circuit substrate 61 and a lower circuit substrate 62 that are laminated with flexible boards 111-1 to 111-4 and spacer boards 113-1 and 113-2 connected therebetween. The flexible boards 111-1 to 111-4 and the spacer boards 113-1 and 113-2 are hereinafter collectively referred to as flexible boards 111 and spacer boards 113, respectively, unless they are individually distinguished.

Lands (not shown) are formed in opposed regions of the bottom surface 61b of the circuit substrate 61 and the top surface 62a of the circuit substrate 62. In addition, lands (not shown) corresponding to the above lands are formed on the top and bottom surfaces of the spacer boards 113-1 and 113-2. The lands formed on the bottom surface 61b of the circuit substrate 61 are electrically and mechanically connected to the lands formed on the top surfaces of the spacer boards 113-1 and 113-2 with connecting members 114-1 and 114-2 made of, for example, solder. On the other hand, the lands formed on the top surface 62a of the circuit substrate 62 are electrically and mechanically connected to the lands formed on the bottom surfaces of the spacer boards 113-1 and 113-2 with connecting members 115-1 and 115-2 made of, for example, solder. Thus, the circuit substrates 61 and 62 are electrically connected to each other through the spacer boards 113-1 and 113-2.

In FIG. 6, three connecting members 114-1, three connecting members 114-2, three connecting members 115-1, and three connecting members 115-2 are shown, which are hereinafter collectively referred to as connecting members 114 and 115 unless they are individually distinguished.

The spacer boards 113-1 and 113-2 are composed of, for example, an insulating rigid board such as a glass-epoxy board, as with the circuit substrates 61 and 62. The spacer boards 113-1 and 113-2 function to electrically connect the circuit substrates 61 and 62 and define a predetermined distance therebetween. The distance between the circuit substrates 61 and 62 may be adjusted to 0.4 to 1.6 mm according to the thickness of the spacer boards 113-1 and 113-2. Accordingly, electronic components, such as semiconductor chips, with a thickness smaller than the distance between the circuit substrates 61 and 62 may be incorporated therebetween.

The flexible boards 111 are made of, for example, a polyimide film, instead of an insulating board, as with the flexible boards 63. In the electronic circuit device 101, the top surface of the flexible board 111-1 (the surface opposed to the circuit substrate 61) is electrically and mechanically connected to a left end region 61L of the bottom surface 61b of the circuit substrate 61 with, for example, solder, a metal paste, or an anisotropic conductive film, as described above with reference to FIGS. 5A to 5C. On the other hand, the top surface of the flexible board 111-2 is electrically and mechanically connected to a right end region 61R of the bottom surface 61b of the circuit substrate 61 with, for example, solder, a metal paste, or an anisotropic conductive film.

Similarly, the bottom surface of the flexible board 111-3 (the surface opposed to the circuit substrate 62) is electrically and mechanically connected to a left end region 62L of the top surface 62a of the circuit substrate 62 with, for example, solder, a metal paste, or an anisotropic conductive film. On the other hand, the bottom surface of the flexible board 111-4 is electrically and mechanically connected to a right end region 62R of the top surface 62a of the circuit substrate 62 with, for example, a metal paste or an anisotropic conductive film.

Though the electronic circuit device 101 in FIG. 6 has the four flexible boards 111, more flexible boards 111 may be connected in practice; the number of flexible boards 111 connected to the electronic circuit device 101 is not limited. In addition, similarly, though the electronic circuit device 101 in FIG. 6 has the two spacer boards 113, more spacer boards 113 may be connected in practice; the number of spacer boards 113 connected to the electronic circuit device 101 is not limited.

In the electronic circuit device 101, as described above, the circuit substrates 61 and 62 are laminated with the spacer boards 113 disposed (connected) therebetween, and the flexible boards 111 are electrically connected to the opposed surfaces of the circuit substrates 61 and 62. As in the embodiment shown in FIG. 4, therefore, no region on the top surface 61a of the circuit substrate 61 and the bottom surface 62b of the circuit substrate 62 is used for connecting the flexible boards 111 for connection to, for example, an external interface or another electronic circuit device. Accordingly, electronic components such as semiconductor chips, chip-type electronic components, resistors, and capacitors may be placed (mounted) on the overall top surface 61a of the circuit substrate 61 and the overall bottom surface 62b of the circuit substrate 62. This allows the electronic circuit device 101 to mount electronic components at high density.

As in the embodiment shown in FIG. 4, additionally, the flexible boards 111 are connected only to the left end region 61L and right end region 61R of the circuit substrate 61 and the left end region 62L and right end region 62R of the circuit substrate 62. The flexible boards 111 may therefore be made of a smaller amount of polyimide than those of the rigid/flexible substrate 11 and the multilayer flexible substrate 12 described above with reference to FIGS. 2A and 2B, in which a polyimide film larger than the rigid boards 21 is used. This results in lower material cost.

Figure 7:
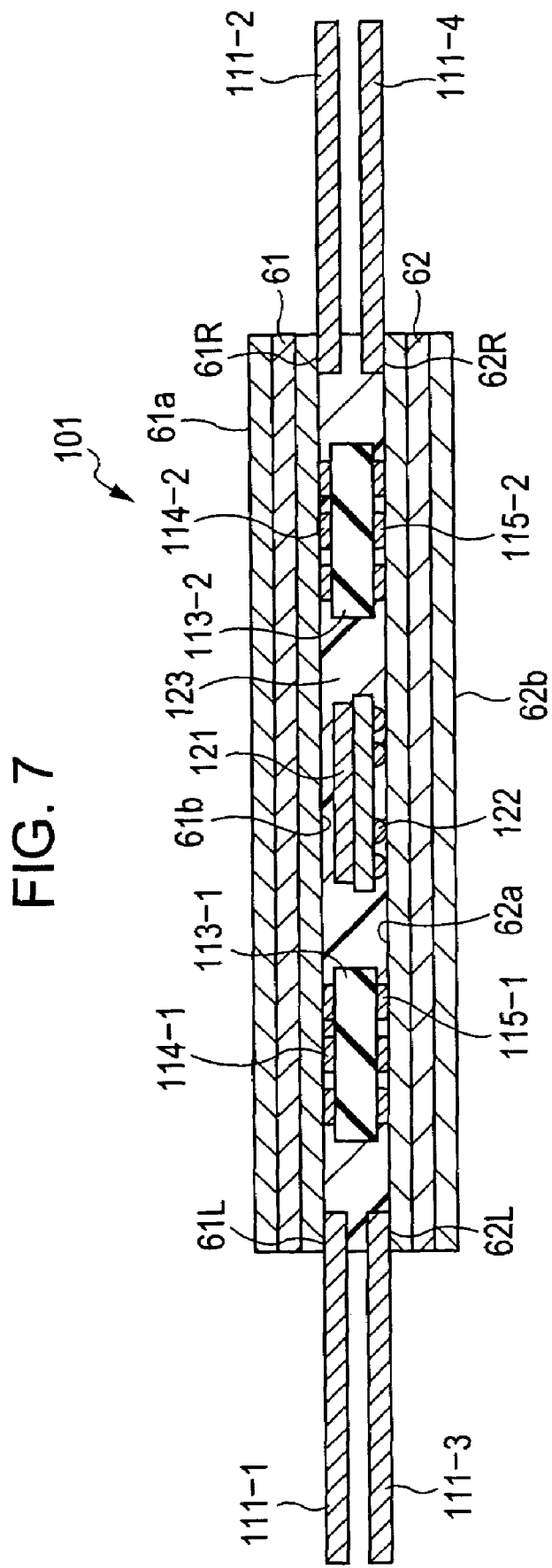
FIG. 7 is a longitudinal sectional view of a modification of the electronic circuit device in FIG. 6.

In the electronic circuit device 101, furthermore, the circuit substrates 61 and 62 are laminated with the spacer boards 113-1 and 113-2 disposed therebetween. As shown in FIG. 7, therefore, an electronic component such as a chip-type electronic component may be incorporated in the space, with a height of 0.4 to 1.6 mm, between the laminated circuit substrates 61 and 62. Accordingly, many electronic components may be incorporated between the laminated circuit substrates 61 and 62 by minimizing the left end region 62L and right end region 62R used for connecting the flexible boards 111 so that the electronic component 101 can be produced with high density.

In the embodiment shown in FIG. 7, a chip-type electronic component 121 is incorporated between the circuit substrates 61 and 62 in the electronic circuit device 101 in FIG. 6. The chip-type electronic component 121 is prepared by mounting and packaging a semiconductor chip on a substrate with the active surface thereof facing downward (opposed to the substrate). The chip-type electronic component 121 is electrically and mechanically connected to the circuit substrate 62. As in the methods for connecting the flexible boards 63 described above with reference to FIGS. 5A to 5C, lands (not shown) formed on the bottom surface of the chip-type electronic component 121 (the surface opposed to the circuit substrate 62) are connected to corresponding lands (not shown) formed on the top surface 62a of the circuit substrate 62 with connecting members 122 made of, for example, solder or a conductive paste.

In the electronic circuit device 101 shown in FIG. 7, additionally, a sealing resin 123 is charged into the space between the circuit substrates 61 and 62 to increase the connection strength between the flexible boards 111 and the circuit substrates 61 and 62. The electronic circuit device 101 in FIG. 7 can therefore have smaller minimum regions (61L, 61R, 62L, and 62R) used for connecting the flexible boards 111 to the circuit substrates 61 and 62 than the electronic circuit device 101 in FIG. 6. The sealing resin 123 may also be charged only into the regions used for connecting the flexible boards 111 to the circuit substrates 61 and 62.

Next, examples of methods for connecting the spacer boards 113 to the circuit substrates 61 and 62 are described below with reference to FIGS. 8A to 8C. The methods illustrated in FIGS. 8A to 8C are basically the same as those in FIGS. 5A to 5C; no detailed description is given to avoid repetition.

In an example shown in FIG. 8A, three lands 131 are formed with, for example, copper foil on the bottom surface 61b of the circuit substrate 61, and three lands 132 corresponding to the lands 131 are formed with, for example, copper foil on the top surface 62a of the circuit substrate 62. In addition, lands 133a corresponding to the lands 131 and lands 133b corresponding to the lands 132 are formed on the spacer board 113. The lands 133a and 133b are integrated through through-holes 135. The lands 131 and 133a are connected with a solder 134-1, and the lands 132 and 133b are connected with a solder 134-2. Thus, the spacer board 113 is electrically and mechanically connected to the circuit substrates 61 and 62 so that the circuit substrates 61 and 62 are electrically connected to each other.

The through-holes 135 are formed at the positions corresponding to the lands 131 and 132 in the spacer boards 113, extending from one surface (the top surface) to the other surface (the bottom surface). Thin metal films 133c are formed inside the through-holes 135 by plating with, for example, copper, and the top lands 133a and the bottom lands 133b are formed integrally with the thin metal films 133c by plating.

In an example shown in FIG. 8B, the three lands 131 are formed with, for example, copper foil on the bottom surface 61b of the circuit substrate 61, and the three lands 132 corresponding to the lands 131 are formed with, for example, copper foil on the top surface 62a of the circuit substrate 62. In addition, the lands 133a corresponding to the lands 131 and the lands 133b corresponding to the lands 132 are formed on the spacer board 113. The lands 133a and 133b are integrated through the through-holes 135. The lands 131 and 133a are connected with a metal paste 141-1, and the lands 132 and 133b are connected with a metal paste 141-2. Thus, the spacer board 113 is electrically and mechanically connected to the circuit substrates 61 and 62 so that the circuit substrates 61 and 62 are electrically connected to each other.

In this example, additionally, sealing resins 142-1 and 142-2 (dotted areas) are charged into the spaces between the bottom surface 61b of the circuit substrate 61 and the spacer board 113 and between the top surface 62a of the circuit substrate 62 and the spacer board 113, respectively, to increase the connection strengths therebetween and inhibit the intrusion of, for example, moisture.

In an example shown in FIG. 8C, the three lands 131 are formed with, for example, copper foil on the bottom surface 61b of the circuit substrate 61, and the three lands 132 corresponding to the lands 131 are formed with, for example, copper foil on the top surface 62a of the circuit substrate 62. In addition, the lands 133a corresponding to the lands 131 and the lands 133b corresponding to the lands 132 are formed on the spacer board 113. The lands 133a and 133b are integrated through the through-holes 135. The lands 131 and 133a are connected with an anisotropic conductive film made of a binder 151-1 and conductive particles 152-1, and the lands 132 and 133b are connected with another anisotropic conductive film made of a binder 151-2 and conductive particles 152-2. Thus, the spacer board 113 is electrically and mechanically connected to the circuit substrates 61 and 62 so that the circuit substrates 61 and 62 are electrically connected to each other.

The lands 131 and 133a are electrically connected through the conductive particles 152-1 disposed therebetween. The lands 132 and 133b are electrically connected through the conductive particles 152-2 disposed therebetween.

The method used for connecting the spacer boards 113 to the circuit substrates 61 and 62 is not limited to the above connection methods, and they may also be connected by another method.

Figure 9:
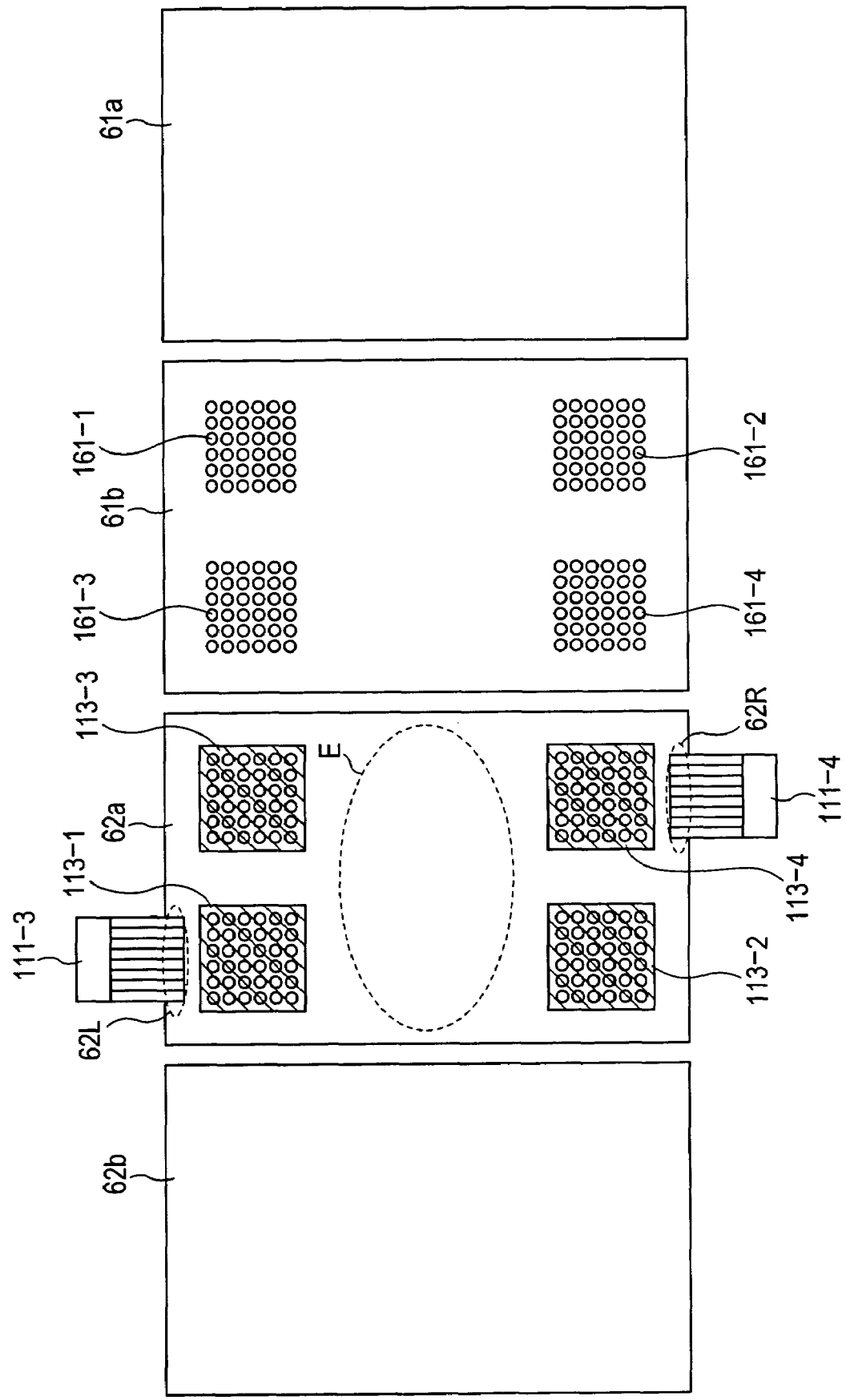
FIG. 9 shows plan views of circuit substrates in the electronic circuit device in FIG. 6.

FIG. 9 shows plan views of the circuit substrates 61 and 62 in FIG. 6. In FIG. 9, the flexible boards 111-1 and 111-2 on the bottom surface 61b of the circuit substrate 61 in FIG. 6 are omitted.

The upper side of the surfaces 62b, 62a, 61b, and 61a in FIG. 9 corresponds to the left side thereof in FIG. 6, and the lower side of the surfaces 62b, 62a, 61b, and 61a in FIG. 9 corresponds to the right side thereof in FIG. 6. FIG. 9 shows, from left to right, a bottom view of the circuit substrate 62 (the bottom surface 62b), a top view of the circuit substrate 62 (the top surface 62a), a bottom view of the circuit substrate 61 (the bottom surface 61b), and a top view of the circuit substrate 61 (the top surface 61a).

In the bottom view of the circuit substrate 62, no member is disposed on the bottom surface 62b of the circuit substrate 62 so that electronic components may be mounted (placed) on the overall bottom surface 62b.

In the top view of the circuit substrate 62, the spacer boards 113-1 (left) and 113-3 (right) are disposed on the upper side of the top surface 62a of the circuit substrate 62, and the spacer boards 113-2 (left) and 113-4 (right) are disposed on the lower side of the top surface 62a of the circuit substrate 62. Circles on the spacer boards 113 represent lands formed on the spacer boards 113. The flexible board 111-3 is connected to the left end region 62L of the top surface 62a on the upper side of the spacer board 113-1, and the flexible board 111-4 is connected to the right end region 62R of the top surface 62a on the lower side of the spacer board 113-4.

Accordingly, the regions of the top surface 62a used for connecting the flexible boards 111-3 and 111-4 are only the left end region 62L and the right end region 62R. Electronic components may therefore be mounted in an empty region E, namely the region other than the left end region 62L, the right end region 62R, and the regions for the flexible boards 113-1 to 113-4.

In addition, as described above, the solders 134-1 and 134-2, the metal pastes 141-1 and 141-2, and the anisotropic conductive films may be removed by heat treatment if, for example, the flexible board 111-3 is moved to the left side of the spacer board 113-1. The position of the flexible board 111-3 may be easily changed by detaching the flexible board 111-3 after heat treatment and connecting it again to the left side of the spacer board 113-1 on the top surface 62a.

In the bottom view of the circuit substrate 61, land groups 161-1 to 161-4 corresponding to the lands formed on the spacer boards 113-1 to 113-4 disposed on the circuit substrate 62 are formed on the bottom surface 61b of the circuit substrate 61. Accordingly, the bottom surface 61b has an empty region corresponding to the empty region E of the top surface 62a of the circuit substrate 62 so that electronic components may be mounted in the empty region E. The electronic components may also be disposed in the empty region of the bottom surface 61b corresponding to the empty region E.

In the top view of the circuit substrate 61, no member is disposed on the top surface 61a of the circuit substrate 61 so that electronic components may be mounted (placed) on the overall top surface 61a.

Figure 10:
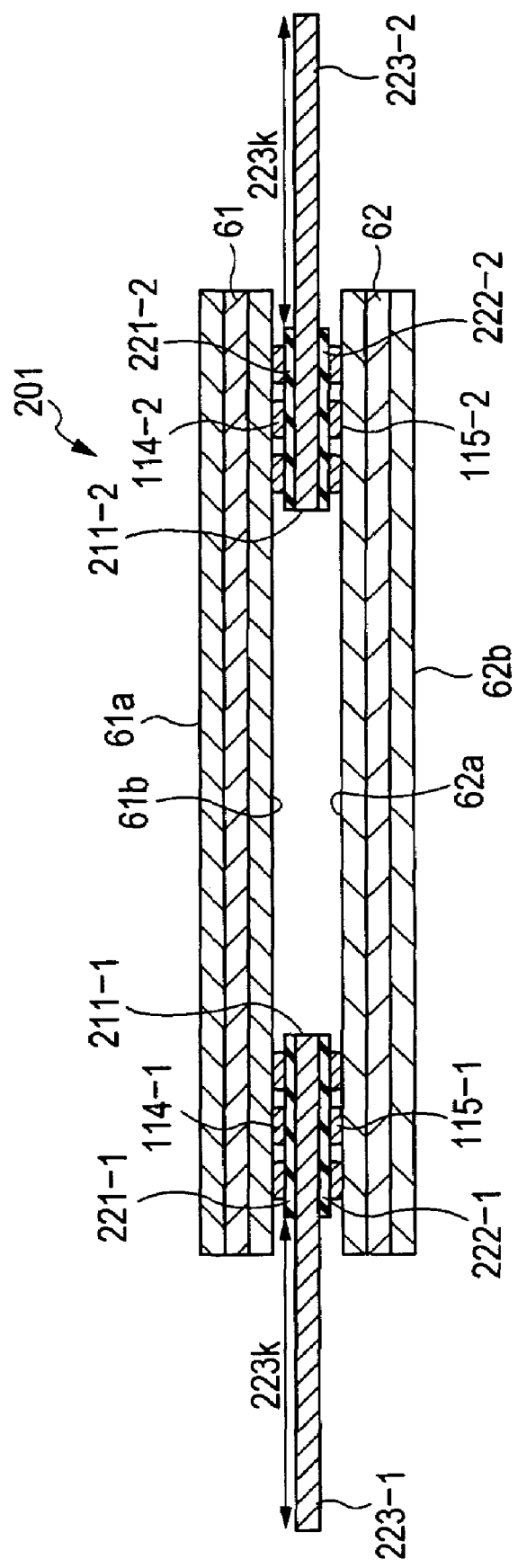
FIG. 10 is a longitudinal sectional view of an electronic circuit device according to another embodiment of the present invention.

FIG. 10 is a longitudinal sectional view of an electronic circuit device according to another embodiment of the present invention. In FIG. 10, the parts corresponding to those in FIG. 4 or 6 are indicated by the corresponding reference numerals, and the description thereof is properly omitted to avoid repetition.

In FIG. 10, an electronic circuit device 201 includes an upper circuit substrate 61 and a lower circuit substrate 62 that are laminated with spacer substrates 211-1 and 211-2 connected therebetween.

The spacer substrates 211-1 and 211-2 are composed of flexible/rigid substrates. Specifically, the spacer substrate 211-1 includes insulating rigid boards 221-1 and 222-1, such as glass-epoxy boards, as with the spacer boards 113. The rigid boards 221-1 and 222-1 are laminated with a flexible board 223-1 made of a polyimide film disposed therebetween. Similarly, the spacer substrate 211-2 includes rigid boards 221-2 and 222-2 laminated with a flexible board 223-2 made of a polyimide film disposed therebetween.

The spacer substrates 211-1 and 211-2, the rigid boards 221-1 and 221-2, the rigid boards 222-1 and 222-2, and the flexible boards 223-1 and 223-2 are hereinafter collectively referred to as spacer substrates 211, rigid boards 221, rigid boards 222, and flexible boards 223, respectively, unless they are individually distinguished. Electrical circuits (not shown) are formed with copper foil on the rigid boards 221, the rigid boards 222, and the flexible boards 223.

The flexible boards 223 are longer than the rigid boards 221 and 222 by the length of cable parts 223k for electrically connecting the electronic circuit device 201 to, for example, an external interface or another electronic circuit device (not shown).

The spacer substrates 211 are electrically and mechanically connected to the bottom surface 61b of the circuit substrate 61 with connecting members 114 and to the top surface 62a of the circuit substrate 62 with connecting members 115. Thus, the circuit substrates 61 and 62 are electrically connected through the spacer substrates 211. In addition, the electronic circuit device 201 may be electrically connected to, for example, another electronic circuit device through the flexible boards 223 included in the spacer substrates 211. That is, the spacer substrates 211 provide the connection between the upper circuit substrate 61 and the lower circuit substrate 62 and side connections to external electronic circuit devices (not shown).

The spacer substrates 211 may also be composed of multilayer flexible substrates. In that case, flexible boards made of polyimide films are used instead of the rigid boards 221 and 222.

In the electronic circuit device 201, as described above, the circuit substrates 61 and 62 are laminated with the spacer substrates 211, which include the flexible boards 223, disposed therebetween, and the flexible boards 223 are electrically connected to the circuit substrates 61 and 62. Electronic components may therefore be placed (mounted) on the overall top surface 61a of the circuit substrate 61 and the overall bottom surface 62b of the circuit substrate 62. In addition, the regions (61L, 61R, 62L, and 62R) for connecting the flexible boards 111 in the electronic circuit device 101 in FIG. 6 are not used in the electronic circuit device 201. Accordingly, the spacer substrates 211 may be disposed closer to the sides (end regions) of the circuit substrates 61 and 62 than the spacer boards 113 in the electronic circuit device 101 in FIG. 6. The electronic circuit device 201 can therefore have a larger empty region E on the top surface 62a in FIG. 9 to incorporate more electronic components.

Furthermore, the spacer substrates 211 (the rigid boards 221) are smaller than the flexible/rigid substrate 11 and the multilayer flexible substrate 12 in FIGS. 2A and 2B (the rigid boards 21 and the flexible boards 31, which have substantially the same size as the circuit substrate 61). The spacer substrates 211 may therefore be formed with a smaller amount of polyimide than the rigid/flexible substrate 11 and the multilayer flexible substrate 12. This results in lower material cost.

Figure 11:
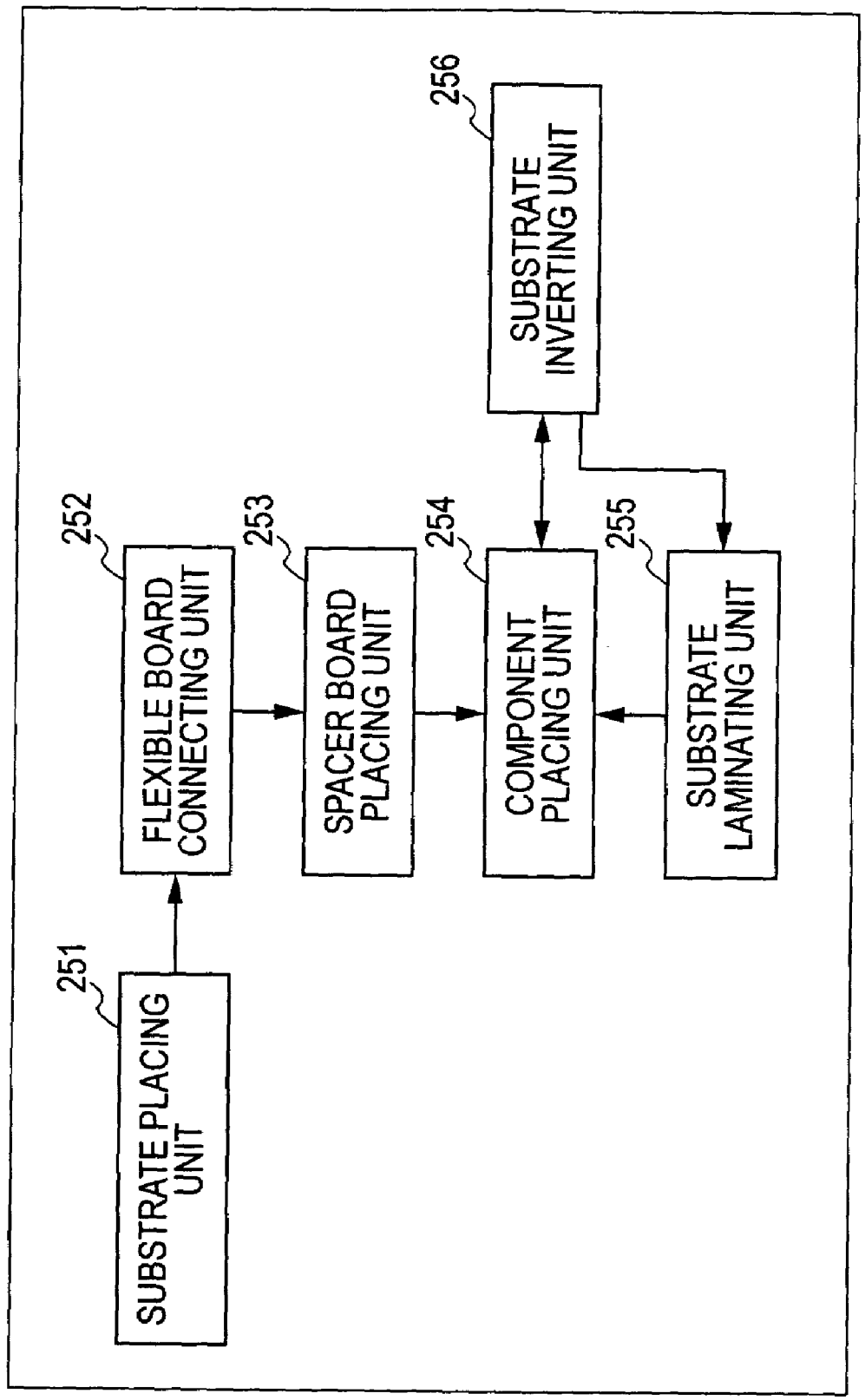
FIG. 11 is a block diagram of an example of a mounting apparatus for producing the electronic circuit devices according to the embodiments of the present invention.

FIG. 11 is a block diagram of an example of a mounting apparatus for producing the electronic circuit devices according to the embodiments of the present invention. This mounting apparatus includes a substrate placing unit 251, a flexible board connecting unit 252, a spacer board placing unit 253, a component placing unit 254, a substrate laminating unit 255, and a substrate inverting unit 256.

The substrate placing unit 251 prepares the circuit substrate 62 and places it at a predetermined position. The flexible board connecting unit 252 prepares a predetermined number of flexible boards and electrically and mechanically connects them to a left end region or a right end region of the top surface 62a of the circuit substrate 62 with, for example, solder, a metal paste, or an anisotropic conductive film.

The spacer board placing unit 253 prepares a predetermined number of spacer boards, and places and electrically and mechanically connects the spacer boards to the top surface 62a of the circuit substrate 62 with connecting members made of, for example, solder, a metal paste, or an anisotropic conductive film such that lands formed on the bottom surfaces of the spacer boards are aligned with lands formed on the top surface 62a of the circuit substrate 62.

The component placing unit 254 places and electrically and mechanically connects electronic components such as semiconductor chips, chip-type electronic components, resistors, and capacitors to the top surface 62a and bottom surface 62b of the circuit substrate 62 and the top surface 61a of the circuit substrate 61, which is laminated on the circuit substrate 62, with connecting members made of, for example, a metal paste or an anisotropic conductive film.

The substrate laminating unit 255 prepares the circuit substrate 61, and places and electrically and mechanically connects the circuit substrate 61 to the spacer boards with connecting members made of, for example, solder, a metal paste, or an anisotropic conductive film such that lands formed on the bottom surface 61b of the circuit substrate 61 are aligned with lands formed on the top surfaces of the spacer boards on the top surface 62a of the circuit substrate 62, thus laminating the circuit substrate 61 on the circuit substrate 62.

The substrate inverting unit 256 inverts the electronic circuit device to laminate the circuit substrate 61 or place (connect) electronic components on the bottom surface 62b of the circuit substrate 62 and the top surface 61a of the circuit substrate 61.

Next, a mounting process for producing an electronic circuit device according to an embodiment of the present invention will be described below with reference to FIGS. 12, 13A to 13C, and 14A and 14B. In FIGS. 13A to 13C and 14A and 14B, the parts corresponding to those in FIGS. 4 and 6 are indicated by the corresponding reference numerals, and the description thereof is properly omitted to avoid repetition.

In Step S1, the substrate placing unit 251 prepares the circuit substrate 62 and places it at a predetermined position. The circuit substrate 62 includes three laminated insulating rigid boards, such as glass-epoxy boards, having an electrical circuit made of copper foil (not shown).

Figure 13A:
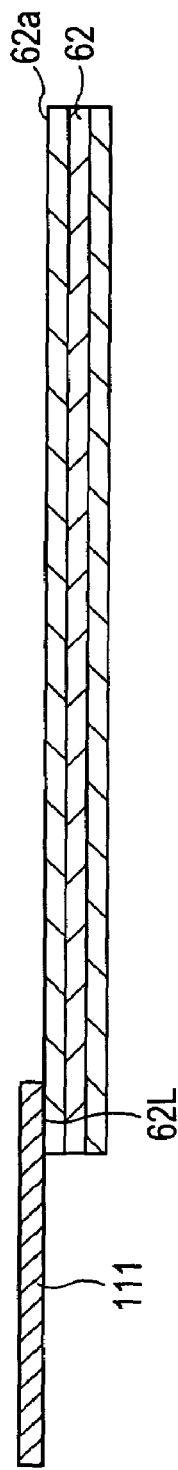
FIGS. 13A to 13C are diagrams illustrating mounting steps for the electronic circuit device.

Referring to FIG. 13A, in Step S2, the flexible board connecting unit 252 prepares the flexible board 111 and electrically and mechanically connects it to the left end region 62L of the top surface 62a of the circuit substrate 62 with, for example, the solder 73, the metal paste 81, or the anisotropic conductive film, as described above with reference to FIGS. 5A to 5C.

Figure 13B:
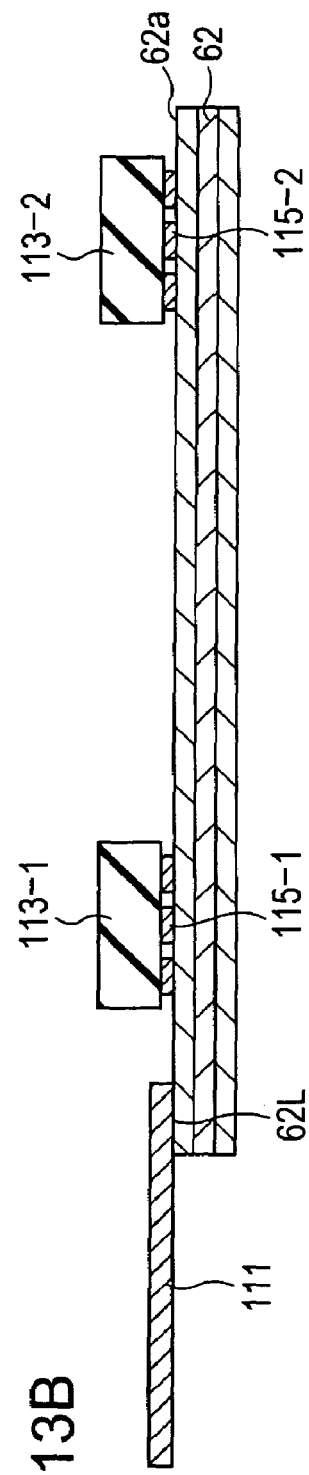

Referring to FIG. 13B, in Step S3, the spacer board placing unit 253 prepares spacer boards 113-1 and 113-2 and electrically and mechanically connects them to the top surface 62a of the circuit substrate 62 with the connecting members 115-1 and 115-2, which are made of, for example, solder, a metal paste, or an anisotropic conductive film.

Specifically, the spacer board placing unit 253 places and electrically and mechanically connects the spacer boards 113-1 and 113-2 to the top surface 62a of the circuit substrate 62 with the connecting members 115-1 and 115-2, which are made of, for example, the solder 73, the metal paste 81, or the anisotropic conductive film, as described above with reference to FIGS. 8A to 8C, such that lands (not shown) formed on the bottom surfaces of the spacer boards 113-1 and 113-2 are aligned with lands formed on the top surface 62a of the circuit substrate 62.

Figure 13C:
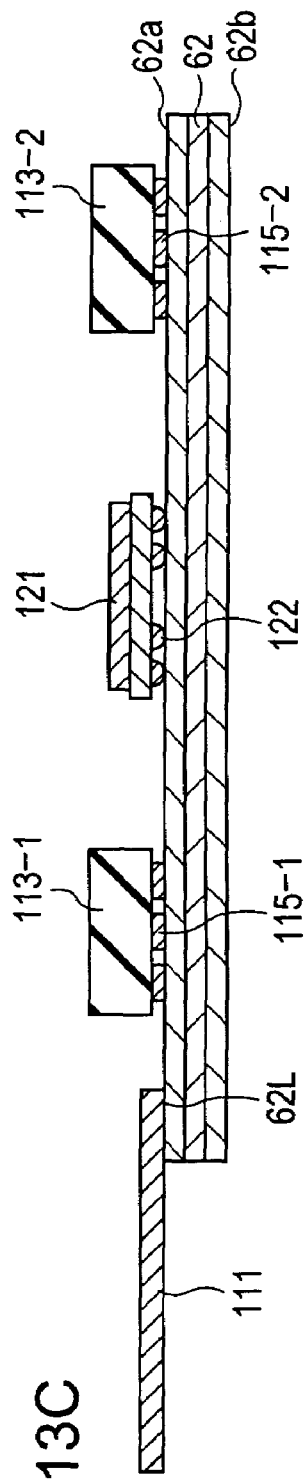

Referring to FIG. 13C, in Step S4, the component placing unit 254 prepares the chip-type electronic component 121 to be incorporated between the circuit substrates 61 and 62, and electrically and mechanically connects the chip-type electronic component 121 to the top surface 62a of the circuit substrate 62 with the connecting members 122, which are made of, for example, solder, a metal paste, or an anisotropic conductive film.

Specifically, the component placing unit 254 places and electrically and mechanically connects the chip-type electronic component 121 to the top surface 62a of the circuit substrate 62 with the connecting members 122, which are made of, for example, a metal paste or an anisotropic conductive film, as in the method for connecting the spacer boards 113, such that lands formed on the bottom surface of the chip-type electronic component 121 (the surface opposed to the circuit substrate 62) are aligned with lands formed on the top surface 62a of the circuit substrate 62.

After the chip-type electronic component 121 is placed on the top surface 62a of the circuit substrate 62, in Step S5, the substrate laminating unit 255 prepares the circuit substrate 61 and laminates it on the circuit substrate 62.

Specifically, after the substrate laminating unit 255 prepares the circuit substrate 61, the substrate inverting unit 256 inverts the circuit substrate 62, on which the spacer boards 113-1 and 113-2 and the chip-type electronic component 121 are placed. The substrate laminating unit 255 then places and electrically and mechanically connects the circuit substrate 61 to the spacer boards 113-1 and 113-2 with the connecting members 114-1 and 114-2, which are made of, for example, solder, a metal paste, or an anisotropic conductive film, such that lands formed on the bottom surface 61b of the circuit substrate 61 are aligned with lands formed on the top surfaces of the spacer boards 113-1 and 113-2 (the surface opposed to the circuit substrate 61) placed (connected) on the circuit substrate 62, thus laminating the circuit substrate 61 on the circuit substrate 62, as shown in FIG. 14A.

After the circuit substrates 61 and 62 are laminated, in Step S6, the component placing unit 254 places and electrically and mechanically connects electronic components such as semiconductor chips, chip-type electronic components, resistors, and capacitors to the outsides of the circuit substrates 61 and 62 (namely, the top surface 61a and the bottom surface 62b) with connecting members made of, for example, a metal paste or an anisotropic conductive film.

Step S6 is specifically described below. First, the component placing unit 254 places predetermined electronic components on the bottom surface 62b of the circuit substrate 62 (the upper side in FIG. 14A). Specifically, the component placing unit 254 places and electrically and mechanically connects a resistor 301 to the left end (in FIG. 14A) of the bottom surface 62b of the circuit substrate 62 with, for example, solder such that electrodes (not shown) of the resistor 301 are aligned with lands formed on the bottom surface 62b of the circuit substrate 62, thus fixing the resistor 301 on the circuit substrate 62.

In addition, the component placing unit 254 places and electrically and mechanically connects a chip-type electronic component 302 to the bottom surface 62b of the circuit substrate 62 with connecting members 303 made of, for example, solder, a metal paste, or an anisotropic conductive film such that lands (not shown) on the chip-type electronic component 302 are aligned with lands formed on the right side of the resistor 301, thus fixing the chip-type electronic component 302 on the circuit substrate 62. The component placing unit 254 then places and electrically and mechanically connects a capacitor 304 to the bottom surface 62b of the circuit substrate 62 with, for example, solder such that electrodes (not shown) of the capacitor 304 are aligned with lands formed on the right side of the chip-type electronic component 302, thus fixing the capacitor 304 on the circuit substrate 62.

Furthermore, the component placing unit 254 places and electrically and mechanically connects a chip-type electronic component 305 to the bottom surface 62b of the circuit substrate 62 with connecting members 306 made of, for example, solder, a metal paste, or an anisotropic conductive film such that lands (not shown) on the chip-type electronic component 305 are aligned with lands formed on the right side of the capacitor 304, thus fixing the chip-type electronic component 305 on the circuit substrate 62. The component placing unit 254 then places and electrically and mechanically connects a resistor 307 to the bottom surface 62b of the circuit substrate 62 with, for example, solder such that electrodes (not shown) of the resistor 307 are aligned with lands formed on the right side of the chip-type electronic component 305, thus fixing the resistor 307 on the circuit substrate 62.

After the component placing unit 254 completes the placement of electronic components on the bottom surface 62b of the circuit substrate 62, the substrate inverting unit 256 inverts the electronic circuit device to place (connect) electronic components on the top surface 61a of the circuit substrate 61.

After the electronic circuit device is inverted, the component placing unit 254 places predetermined electronic components on the top surface 61a of the circuit substrate 61. Specifically, the component placing unit 254 places and electrically and mechanically connects a semiconductor chip 311 to the left end (in FIG. 14B) of the top surface 61a of the circuit substrate 61 with connecting members 312 made of, for example, solder, a metal paste, or an anisotropic conductive film such that electrodes (not shown) of the semiconductor chip 311 are aligned with lands formed on the top surface 61a of the circuit substrate 61, thus fixing the semiconductor chip 311 on the circuit substrate 61.

In addition, the component placing unit 254 places and electrically and mechanically connects a capacitor 313 to the top surface 61a of the circuit substrate 61 with, for example, solder such that electrodes (not shown) of the capacitor 313 are aligned with lands formed on the right side of the semiconductor chip 311, thus fixing the capacitor 313 on the circuit substrate 61. The component placing unit 254 then places and electrically and mechanically connects a chip-type electronic component 314 to the top surface 61a of the circuit substrate 61 with connecting members 315 made of, for example, solder, a metal paste, or an anisotropic conductive film such that lands (not shown) on the chip-type electronic component 314 are aligned with lands formed on the right side of the capacitor 313, thus fixing the chip-type electronic component 314 on the circuit substrate 61.

Furthermore, the component placing unit 254 places and electrically and mechanically connects a resistor 316 to the top surface 61a of the circuit substrate 61 with, for example, solder such that electrodes (not shown) of the resistor 316 are aligned with lands formed on the right side of the chip-type electronic component 314, thus fixing the resistor 316 on the circuit substrate 61.

Referring to FIG. 14B, as described above, the electronic components are mounted (placed) on the overall top surface 61a of the circuit substrate 61 and the overall bottom surface 62b of the circuit substrate 62 and in an empty region between the circuit substrates 61 and 62 (for example, the region E in FIG. 9). Thus, the mounting process is completed so that a high-density electronic circuit device is produced.

As described above, the circuit substrates 61 and 62 are laminated with the flexible board 111, for electrical connection to an external electronic circuit device, connected therebetween. Accordingly, the electronic components may be mounted on the overall outer surfaces of the circuit substrates 61 and 62 to produce a high-density, high-performance electronic circuit device.

In addition, the flexible board 111 is connected only to the left end region 62L or right end region 62R of the circuit substrate 62. The flexible board 111 may therefore be made of a smaller amount of polyimide than the flexible board 22 or 32 in FIGS. 2A and 2B. This results in lower material cost. Furthermore, many electronic components may be incorporated between the laminated circuit substrates 61 and 62 to produce a high-density electronic circuit device.

Though the electronic circuit devices described above include two laminated circuit substrates, the number of circuit substrates laminated is not particularly limited; another circuit substrate may be laminated on the circuit substrate 61 or 62.

The steps represented in the flowchart of the present specification do not necessarily have to be carried out sequentially in the described order, and may also be carried out in parallel or separately.

It should be understood by those skilled in the art that various modifications, combinations, sub-combinations and alterations may occur depending on design requirements and other factors insofar as they are within the scope of the appended claims or the equivalents thereof.

What is claimed is

1. An electronic circuit device comprising:
   at least two circuit substrates for mounting electronic components;
   at least two flexible boards configured to be bent to make an electrical connection with an element outside of said electronic circuit device and extending between both the circuit substrates, a first flexible board of the at least two flexible boards being physically and electrically connected to only one surface of one circuit substrate opposed to another circuit substrate without being physically connected to the another circuit substrate, a second flexible board of the at least two flexible boards being physically and electrically connected to only one surface of the another circuit substrate without being physically connected to the one circuit substrate; and
   a spacer board disposed between the circuit substrates, the spacer board physically and electrically connecting the circuit substrates to each other.

2. The electronic circuit device according to claim 1, wherein the first flexible board is electrically and physically connected to a predetermined region of the surface of the one circuit substrate with a solder, a metal paste, or an anisotropic conductive adhesive.

3. The electronic circuit device according to claim 1, wherein the spacer board is electrically and physically connected to the circuit substrates with a solder, a metal paste, or an anisotropic conductive adhesive.

4. An electronic circuit device comprising:
   at least two circuit substrates for mounting electronic components;
   at least two flexible boards configured to be bent to make an electrical connection with an element outside of said electronic circuit device and extending between both the circuit substrates, a first flexible board of the at least two flexible boards being physically and electrically connected to at least the surface of one circuit substrate opposed to another circuit substrate without being physically connected to the another circuit substrate, a second flexible board of the at least two flexible boards being physically and electrically connected to only one surface of the another circuit substrate without being physically connected to the one circuit substrate; and
   a spacer board including rigid portions and flexible portions, the spacer board disposed between the circuit substrates, the spacer board electrically and physically connected to the circuit substrates, the circuits substrates being electrically connected through the spacer board.

5. The electronic circuit device according to claim 4, wherein the spacer board is electrically and physically connected to the circuit substrates with a solder, a metal paste or an anisotropic conductive adhesive.

6. The electronic circuit device according to claim 4, wherein the first flexible board is electrically connected to the one circuit substrate through the spacer board.

7. An electronic circuit device comprising:
   at least two circuit substrates for mounting electronic components; and
   at least two flexible boards configured to be bent to make an electrical connection with an element outside of said electronic circuit device and extending between both the circuit substrates, a first flexible board of the at least two flexible boards being electrically and Physically connected to at least a surface of one circuit substrate opposed to another circuit substrate without being connected to the another circuit substrate, a second flexible board of the at least two flexible boards being physically and electrically connected to only one surface of the another circuit substrate without being physically connected to the one circuit substrate, the first flexible board including a spacer board and being electrically connected to the circuit substrates through the spacer board.

* * * * *